(12) United States Patent
Tran et al.

(10) Patent No.: US 10,216,242 B2
(45) Date of Patent: *Feb. 26, 2019

(54) POWER SEQUENCING FOR EMBEDDED FLASH MEMORY DEVICES

(71) Applicant: Silicon Storage Technology, Inc., San Jose, CA (US)

(72) Inventors: Hieu Van Tran, San Jose, CA (US); Thuan Vu, San Jose, CA (US); Anh Ly, San Jose, CA (US); Hung Quoc Nguyen, Fremont, CA (US)

(73) Assignee: SILICON STORAGE TECHNOLOGY, INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/610,612

(22) Filed: May 31, 2017

(65) Prior Publication Data

US 2017/0269662 A1 Sep. 21, 2017

Related U.S. Application Data

(62) Division of application No. 15/088,038, filed on Mar. 31, 2016, now Pat. No. 9,678,553, which is a division
(Continued)

(51) Int. Cl.
| | | |
|---|---|---|
| *G11C 5/14* | (2006.01) | |
| *G06F 1/26* | (2006.01) | |
| *G06F 1/28* | (2006.01) | |
| *G11C 7/20* | (2006.01) | |
| *G11C 16/30* | (2006.01) | |
| *H03K 19/0185* | (2006.01) | |
| *G11C 11/4074* | (2006.01) | |

(52) U.S. Cl.
CPC ............... *G06F 1/266* (2013.01); *G06F 1/28* (2013.01); *G11C 5/14* (2013.01); *G11C 5/143* (2013.01); *G11C 5/147* (2013.01); *G11C 5/148* (2013.01); *G11C 7/20* (2013.01); *G11C 16/30* (2013.01); *H03K 19/018521* (2013.01); *G11C 11/4074* (2013.01)

(58) Field of Classification Search
CPC .......... G11C 5/14; G11C 5/143; G11C 5/147; G11C 5/148; G11C 7/20; G11C 16/30
See application file for complete search history.

(56) References Cited

U.S. PATENT DOCUMENTS

| | | | |
|---|---|---|---|
| 5,892,711 | A | 4/1999 | Park |
| 6,593,790 | B2 | 7/2003 | Kim |

(Continued)

FOREIGN PATENT DOCUMENTS

| | | | |
|---|---|---|---|
| JP | H06-236694 A | 8/1994 | |
| JP | H09-270196 A | 10/1997 | |

(Continued)

*Primary Examiner* — Pho M Luu
(74) *Attorney, Agent, or Firm* — DLA Piper LLP US

(57) ABSTRACT

A system and method for improved power sequencing within an embedded flash memory device is disclosed. Various power-on sequences and power-down sequences for a plurality of voltage sources are utilized to improve the performance of an embedded flash memory device. The plurality of voltage sources can be used for different purposes within the embedded flash memory device.

11 Claims, 15 Drawing Sheets

Related U.S. Application Data of application No. 14/290,779, filed on May 29, 2014, now Pat. No. 9,417,675.

(56) References Cited

U.S. PATENT DOCUMENTS

| | | |
|---|---|---|
| 6,925,026 B2 | 8/2005 | Isono |
| 6,977,833 B2 | 12/2005 | Day |
| 7,167,017 B2 | 1/2007 | Arora |
| 7,915,930 B2 | 3/2011 | Sohn |
| 7,990,773 B2 | 8/2011 | Tran et al. |
| 8,072,815 B2 | 12/2011 | Tran et al. |
| 8,294,448 B2 | 10/2012 | Nakakubo |
| 8,587,366 B2 | 11/2013 | Im |
| 8,836,166 B2 * | 9/2014 | Maher ............... H02H 1/06 307/104 |
| 9,417,675 B2 * | 8/2016 | Tran ............... G11C 5/143 |
| 9,678,553 B2 * | 6/2017 | Tran ............... G11C 5/143 |
| 2006/0145749 A1 | 7/2006 | Bhattacharya |
| 2009/0230770 A1 | 9/2009 | Takeuchi |
| 2014/0354234 A1 * | 12/2014 | Sudan ............... H02J 7/0055 320/127 |

FOREIGN PATENT DOCUMENTS

| | | |
|---|---|---|
| JP | H11-095877 A | 4/1999 |
| JP | 2003-162895 A | 6/2003 |
| JP | 2004-139594 A | 5/2004 |
| JP | 2006-042304 A | 2/2006 |
| JP | 2007 012134 A | 1/2007 |
| JP | 2010-518544 A | 5/2010 |

* cited by examiner

POWER SEQUENCING FOR EMBEDDED FLASH MEMORY DEVICES

PRIORITY CLAIM

This application is a divisional of U.S. application Ser. No. 15/088,038, filed on Mar. 31, 2016, and titled "Power Sequencing For Embedded Flash Memory Devices," now U.S. Pat. No. 9,678,553, which is a divisional of U.S. application Ser. No. 14/290,779, filed on May 29, 2014, and titled "Power Sequencing For Embedded Flash Memory Devices," now U.S. Pat. No. 9,417,675, both of which are incorporated herein by reference.

TECHNICAL FIELD

A system and method for improved power sequencing within an embedded flash memory device is disclosed.

BACKGROUND OF THE INVENTION

Flash memory cells using a floating gate to store charges thereon and memory arrays of such non-volatile memory cells formed in a semiconductor substrate are well known in the art. Typically, such floating gate memory cells have been of the split gate type, or stacked gate type.

One prior art non-volatile memory cell 10 is shown in FIG. 1. The split gate SuperFlash (SF) memory cell 10 comprises a semiconductor substrate 1 of a first conductivity type, such as P type. The substrate 1 has a surface on which there is formed a first region 2 (also known as the source line SL) of a second conductivity type, such as N type. A second region 3 (also known as the drain line) also of a second conductivity type, such as N type, is formed on the surface of the substrate 1. Between the first region 2 and the second region 3 is a channel region 4. A bit line (BL) 9 is connected to the second region 3. A word line (WL) 8 (also referred to as the select gate) is positioned above a first portion of the channel region 4 and is insulated therefrom. The word line 8 has little or no overlap with the second region 3. A floating gate (FG) 5 is over another portion of the channel region 4. The floating gate 5 is insulated therefrom, and is adjacent to the word line 8. The floating gate 5 is also adjacent to the first region 2. A coupling gate (CG) 7 (also known as control gate) is over the floating gate 5 and is insulated therefrom. An erase gate (EG) 6 is over the first region 2 and is adjacent to the floating gate 5 and the coupling gate 7 and is insulated therefrom. The erase gate 6 is also insulated from the first region 2.

One exemplary operation for erase and program of prior art non-volatile memory cell 10 is as follows. The cell 10 is erased, through a Fowler-Nordheim tunneling mechanism, by applying a high voltage on the erase gate EG 6 with other terminals equal to zero volt. Electrons tunnel from the floating gate FG 5 into the erase gate EG 6 causing the floating gate FG 5 to be positively charged, turning on the cell 10 in a read condition. The resulting cell erased state is known as '1' state. Another embodiment for erase is by a applying a positive voltage Vegp on the erase gate EG 6, a negative voltage Vcgn on the coupling gate CG 7, and others terminal equal to zero volts. The negative voltage Vcgn couples negatively the floating gate FG 5, hence less positive voltage Vcgp is required for erasing. Electrons tunnel from the floating gate FG 5 into the erase gate EG 6 causing the floating gate FG 5 to be positively charged, turning on the cell 10 in a read condition (cell state '1'). Alternately the wordline WL 8 (Vwle) and the source line SL 2 (Vsle) can be negative to further reduce the positive voltage on the erase gate FG 5 needed for erase. The magnitude of negative voltage Vwle and Vsle in this case is small enough not to forward the p/n junction. The cell 10 is programmed, through a source side hot electron programming mechanism, by applying a high voltage on the coupling gate CG 7, a high voltage on the source line SL 2, a medium voltage on the erase gate EG 6, and a programming current on the bit line BL 9. A portion of electrons flowing across the gap between the word line WL 8 and the floating gate FG 5 acquire enough energy to inject into the floating gate FG 5 causing the floating gate FG 5 to be negatively charged, turning off the cell 10 in read condition. The resulting cell programmed state is known as '0' state.

The cell 10 can be inhibited in programming (if, for instance, another cell in its row is to be programmed but cell 10 is to not be programmed) by applying an inhibit voltage on the bit line BL 9. A split gate flash memory operation and various circuitry are described in U.S. Pat. No. 7,990,773, "Sub Volt Flash Memory System," by Hieu Van Tran, et al, and U.S. Pat. No. 8,072,815, "Array of Non-Volatile Memory Cells Including Embedded Local and Global Reference Cells and Systems," by Hieu Van Tran, et al, which are incorporated herein by reference.

FIG. 2 depicts a typical prior art architecture for a two-dimensional prior art flash memory system. Die 12 comprises: memory array 15 and memory array 20 for storing data, the memory array optionally utilizing memory cell 10 as in FIG. 1; pad 35 and pad 80 for enabling electrical communication between the other components of die 12 and, typically, wire bonds (not shown) that in turn connect to pins (not shown) or package bumps that are used to access the integrated circuit from outside of the packaged chip or macro interface pins (not shown) for interconnecting to other macros on a SOC (system on chip); high voltage circuit 75 used to provide positive and negative voltage supplies for the system; control logic 70 for providing various control functions, such as redundancy and built-in self-testing; analog circuit 65; sensing circuits 60 and 61 used to read data from memory array 15 and memory array 20, respectively; row decoder circuit 45 and row decoder circuit 46 used to access the row in memory array 15 and memory array 20, respectively, to be read from or written to; column decoder 55 and column decoder 56 used to access the column in memory array 15 and memory array 20, respectively, to be read from or written to; charge pump circuit 50 and charge pump circuit 51, used to provide increased voltages for program and erase operations for memory array 15 and memory array 20, respectively; high voltage driver circuit 30 shared by memory array 15 and memory array 20 for read and write (erase/program) operations; high voltage driver circuit 25 used by memory array 15 during read and write operations and high voltage driver circuit 26 used by memory array 20 during read and write (erase/program) operations; and bitline inhibit voltage circuit 40 and bitline inhibit voltage circuit 41 used to un-select bitlines that are not intended to be programmed during a write operation for memory array 15 and memory array 20, respectively. These functional blocks are understood by those of ordinary skill in the art, and the block layout shown in FIG. 2 is known in the prior art.

With reference to FIG. 3, a prior art embedded flash memory system 100 is depicted. Embedded flash memory system 100 comprises power management unit 101, microcontroller unit core 102, peripherals 103 (USBx, SPI, I2C, UART, ADC, DAC, PWM, MC, HMI), SRAM 104, embedded flash device 105, and power supply bus 106. Embedded flash device 105 optionally can follow the design of FIGS. 1 and 2, described above. Power management unit 101 generates a plurality of voltages that are provided on power supply bus 106. Three examples of voltages provided on power supply bus 106 are VDD, VDDCORE, and VDD-FLASH. VDD commonly is relatively high, such as 2.5 V, VDDCore is relatively low, such as 1.2 V, and VDDFLASH is also relatively high, such as 2.5 V, and in some cases is equal to VDDCORE. VDDCORE often is used to power the control logic of embedded flash memory system 100. VDD often is used to power all other functions.

With reference to FIG. 4, a typical power sequence operation is depicted for prior art embedded flash memory system 100. During a power-up sequence, at time TU0, the voltage for Voltage 401 begins to ramp up. At time TU1, the voltage for Voltage 402 begins to ramp up At time TU2, the voltage for Voltage 401 begins to plateau. At time TU3, the voltage for Voltage 402 begins to plateau. Here, Voltage 401 can be VDD, and Voltage 402 can be VDDFLASH.

During a power-down sequence, at time TD0, the voltage for Voltage 402 begins to ramp down. At time TD1, the voltage for Voltage 401 begins to ramp down. At time TD2, the voltage for Voltage 402 reaches 0 V. At time TD3, the voltage for Voltage 401 reaches 0 V.

The prior art power sequencing of FIG. 4 can be problematic. Specifically, in the period between time TU0 and TU1, Voltage 401 may reach a sufficient operating level while Voltage 402 is not at a sufficient operating level. Similarly, in the period between time TU1 and TU2, Voltage 401 may be at a sufficient operating level while Voltage 402 is not yet at a sufficient operating level. In the time period between time TD0 and TD1, Voltage 401 will still be at a sufficient operating level, but Voltage 402 may fall below a sufficient operating level. Between time TD1 and TD2, Voltage 402 will be below a sufficient operating level for at least part of that period while Voltage 401 will still be above a sufficient operating level. Between time TD2 and TD3, Voltage 402 will be below a sufficient operating level, and Voltage 401 may still be at a sufficient operating level for at least part of the period. These inconsistencies of state for Voltage 401 and Voltage 402 can cause problems in the operation of prior art embedded flash memory system 100. For example, logic circuits may not be able to operate before other circuits (such as a charge pump) are ready to operate.

SUMMARY OF THE INVENTION

What is needed is an improved power management unit to generate improved power sequencing for a plurality of voltage sources.

DETAILED DESCRIPTION OF THE PREFERRED EMBODIMENTS

Figure 1:
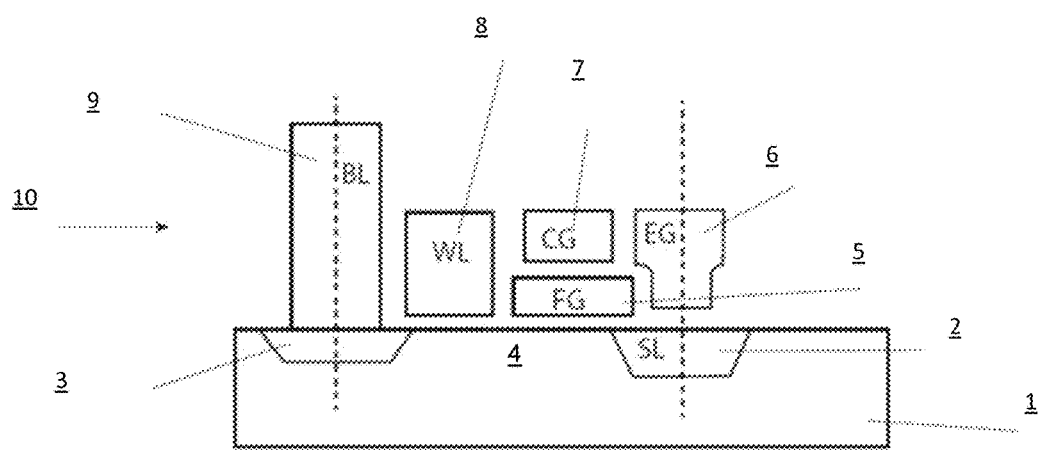
FIG. 1 depicts a prior art split gate flash memory cell.
Figure 2:
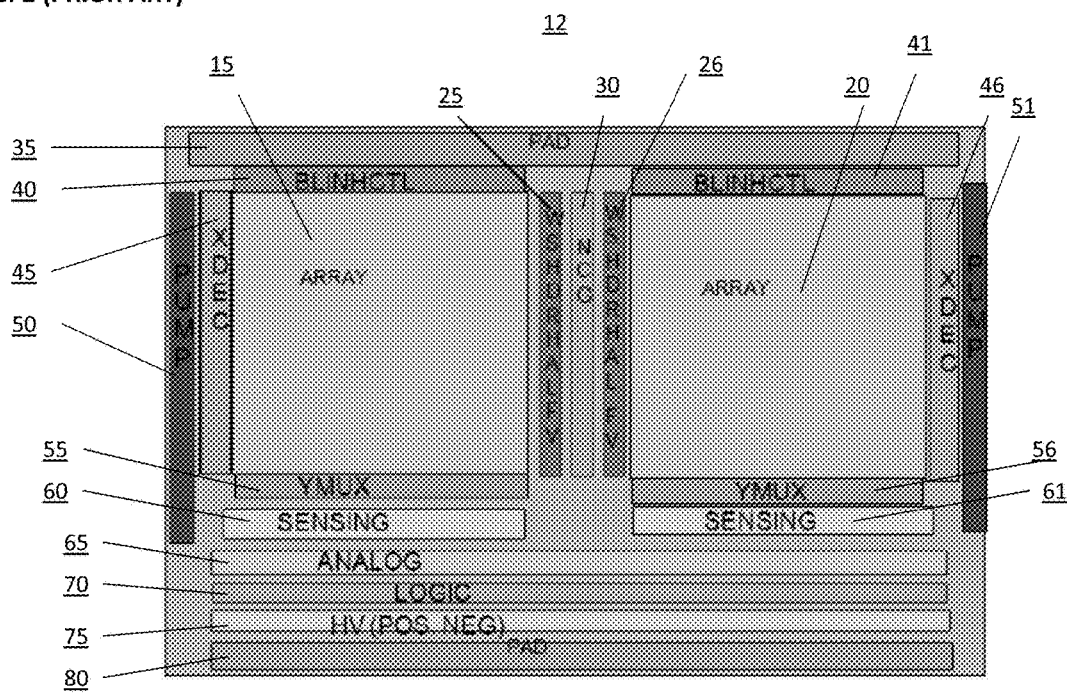
FIG. 2 depicts a layout of a prior art flash memory array.
Figure 3:
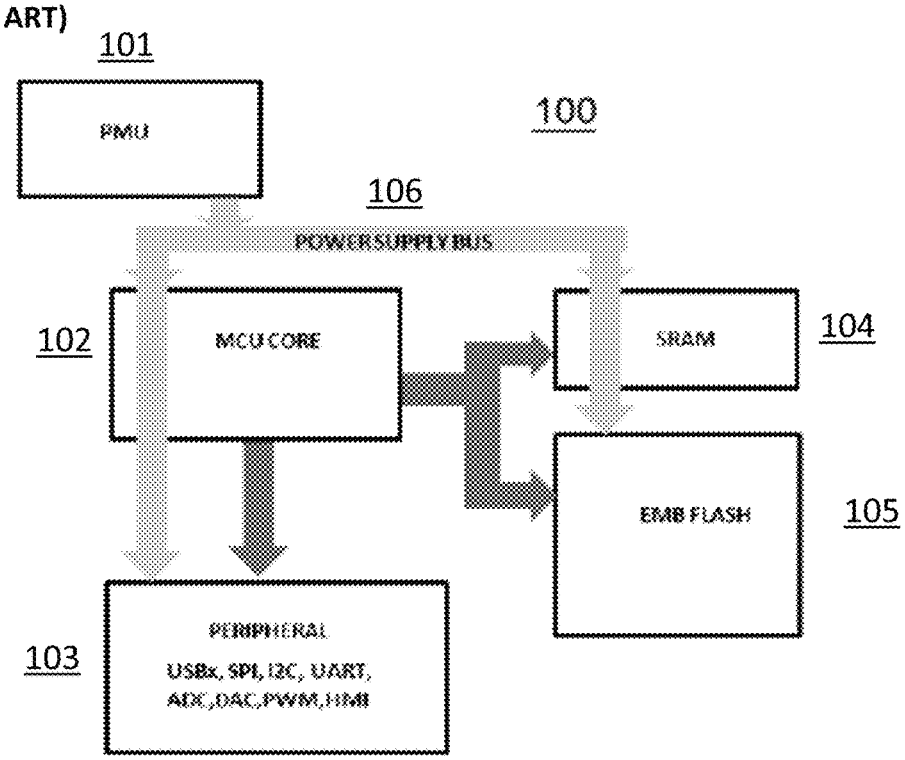
FIG. 3 depicts a prior art embedded flash memory system.
Figure 4:
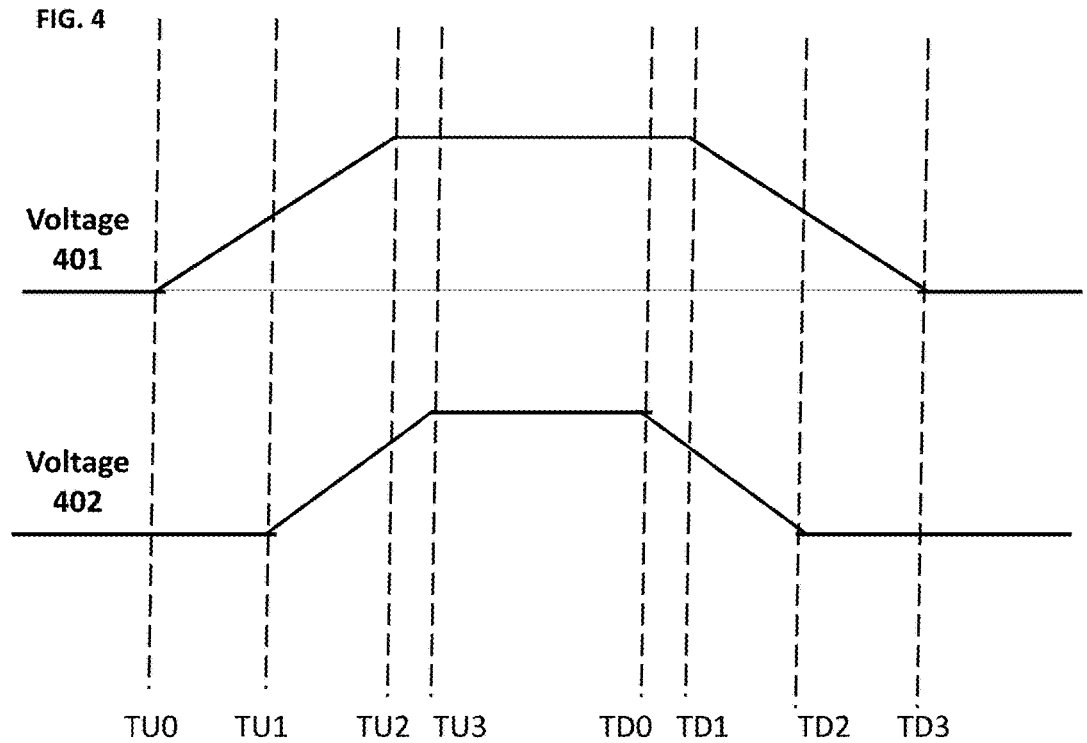
FIG. 4 depicts prior art power sequencing for two voltage sources within an embedded flash memory system.
Figure 5:
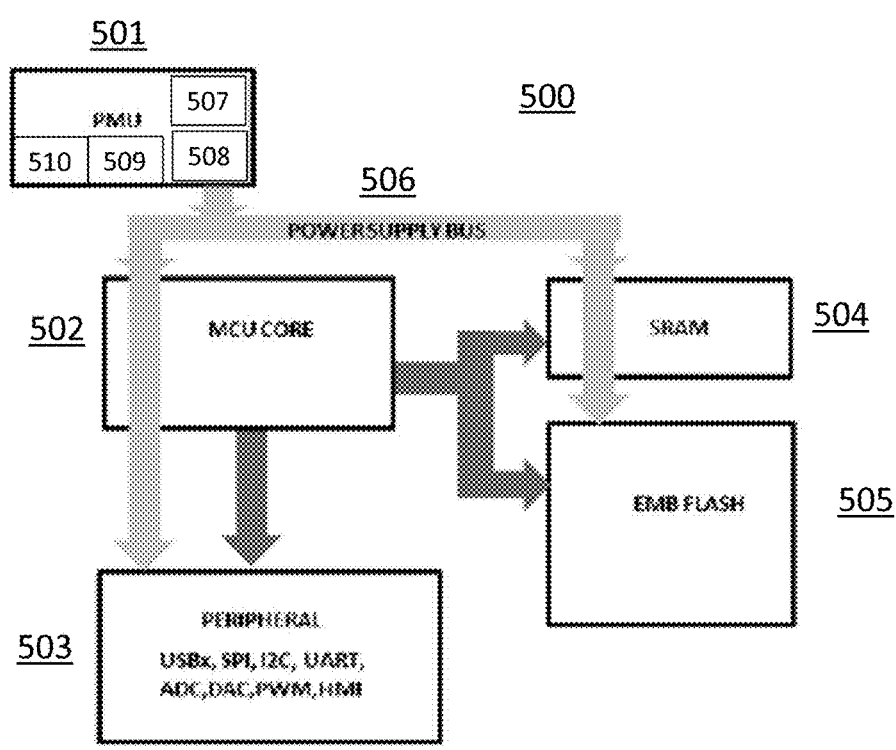
FIG. 5 depicts an embodiment of an embedded flash memory system.

With reference to FIG. 5, an embodiment of an embedded flash memory system 500 is depicted. Embedded flash memory system 500 comprises power management unit 501, microcontroller unit core 502, peripherals 503, SRAM 504, embedded flash device 505, and power supply bus 506. Embedded flash device 505 optionally can follow the design of FIGS. 1 and 2, described above. Power management unit 501 comprises voltage source 507 that generates VDD (main power supply, typically highest voltage level, typically TO voltage level, e.g., 2.5V or 1.8V), voltage source 509 that generates VDDFLASH (typically TO voltage level, e.g., 2.5V or 1.8V), voltage source 508 that generates VDDCORE (typically core logic voltage level, e.g. 1.2V or 0.8V), and voltage source 510 that generates VDDCOREFLASH (typically core logic voltage level, e.g. 1.2V or 0.8V), each of which is provided on power supply bus 506. VDDCOREFLASH and VDDFLASH often are used to power the core logic and (mixed voltage or TO voltage) circuits of embedded flash device 505 respectively, VDDCORE often is used to power all other core control logic of embedded flash memory system 500, and VDD often is used to power all other functions such as analog functions and TO functions. As discussed below, the embodiment of FIG. 5 follows a different power sequencing than in the prior art system of FIG. 3.

Figure 6:
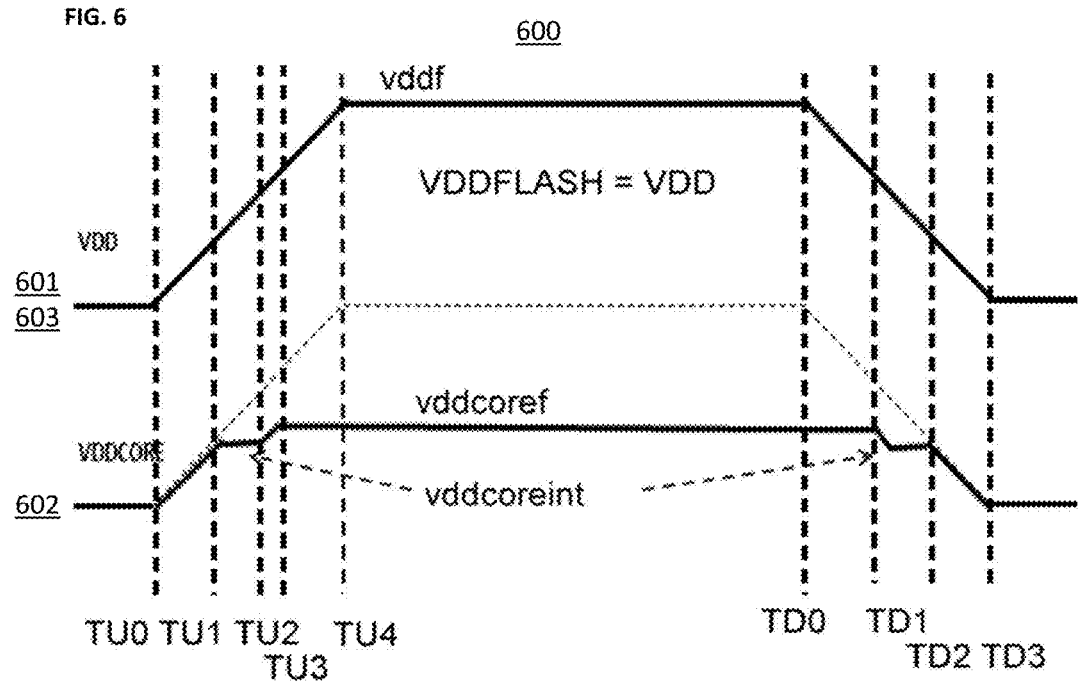
FIG. 6 depicts a power sequencing embodiment.
Figure 7:
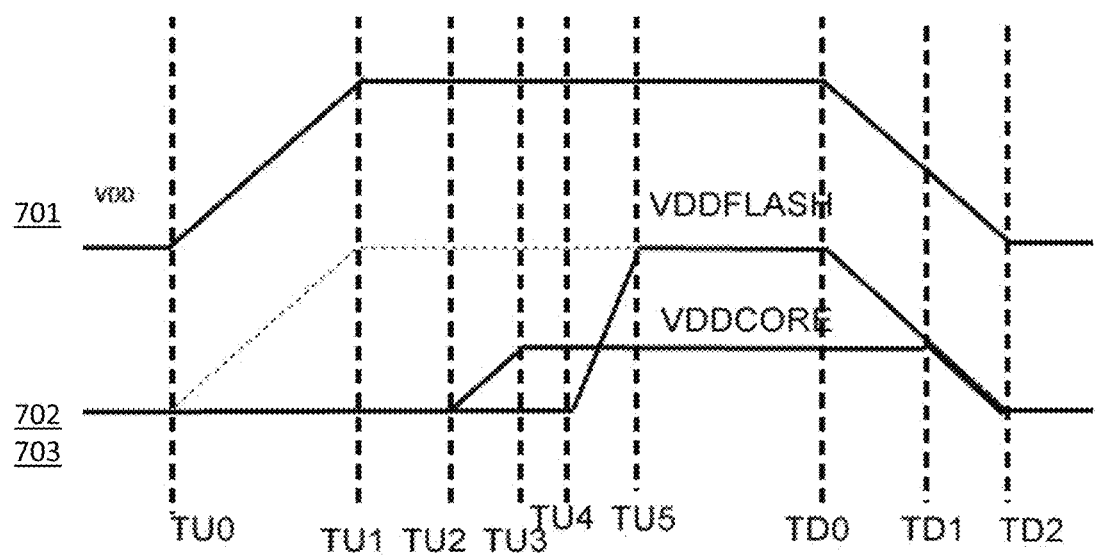
FIG. 7 depicts another power sequencing embodiment.

With reference to FIG. 6, power sequencing mode 600 is depicted. Voltage source 507 generates voltage 601 (VDD) and 603 (VDDFLASH) and voltage source 508 generates voltage 602 (VDDCORE). Here, VDD and VDDFLASH are identical. The period between time TU0 and TU4 depict the power-on (aka, power-up) sequence, and the period between time TD0 and TD3 depicts the power-down sequence. Unlike in the prior art, voltage 601 (VDD, VDDFLASH) and voltage 602 (VDDCORE) begin ramping up at the same time (or approximately at the same time), time TU0, during the power-up sequence, and voltage 601 (VDD, VDDFLASH) and voltage 602 (VDDCORE) reach 0V at the same time (or approximately at the same time), time TD3. In one embodiment, during the ramping up period, the voltage 602 (VDDCORE) follows the voltage 601 (VDD) by an NMOS source follower circuit. In one embodiment, during the ramping down period, the voltage 602 (VDDCORE) follows the voltage 601 (VDD) by a PMOS source follower circuit or a diode connection circuit (a diode connected between VDDCORE and VDD). Voltage 602 (VDDCORE) is plateaued at an intermediate level VDDCOREINT between times TU1 and TU2 and between times TD1 and TD2. The intermediate level VDDCOREINT is such that basic logic gates (e.g., NAND, NOR, INV, DFF, etc.) can start to function digitally. Typically this level is at least equal or greater to maximum of Vtn (NMOS threshold voltage) or Vtp (PMOS threshold voltage) value, for example=~0.3-0.7 Volt. Between TU3 and TD1, the voltage 602 (VDDCORE) is regulated at a final desired voltage level by a precision regulation circuit, With reference to FIG. 7, power sequencing mode 700 is depicted. Voltage source 507 generates voltage 701 (VDD), voltage source 508 generates voltage 702 (VDDCORE), and voltage source 509 generates voltage 703 (VDDFLASH). The period between time TU0 and TU5 depict the power-on sequence, and the period between time TD0 and TD2 depicts the power-down sequence. Unlike in the prior art, voltage 701 (VDD) and voltage 703 (VDDFLASH) begin ramping down at the same time (or approximately at the same time), time TD0, during the power-down sequence, and voltage 701 (VDD), voltage 702 (VDDCORE), and voltage 703 (VDDFLASH) ramp down at the same times at time TD1 (or approximately at the same time), and reach 0V at the same time, time TD2 (or approximately at the same time). During the ramping up, the voltage 702 (VDDCORE) ramps up to a final desired voltage at time TU3, then at some time later at TU4, the voltage 703 (VDDFLASH) begins to ramp up to a final desired voltage at time TU5. In this embodiment, the voltage 702 (VDDCORE) is alive before the voltage 703 (VDDFLASFH), meaning the voltage 702 reaching a desired level first before the voltage 703 starts to ramp up. In this case, the control logic of the embedded flash 505 would be able to function and hence control the chip functionality before circuits of the voltage 703 (VDD-FLASH) starts to function. Typically, the circuits of the voltage 703 (VDFLASH) is mainly controlled by the control logic powered by the voltage 702 (VDDCORE). In one embodiment, during the ramping up time TU0 and TU4, the voltage 703 (VDDFLASH) is at a floating level (high-Z, not being driven).

Figure 8:
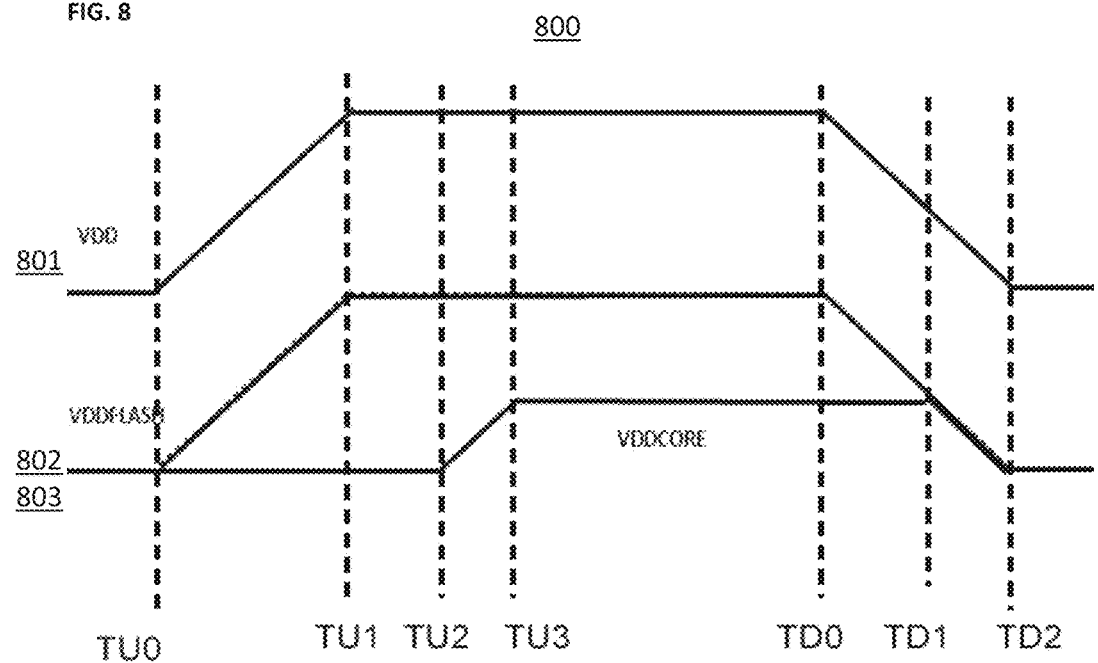
FIG. 8 depicts another power sequencing embodiment.

With reference to FIG. 8, power sequencing mode 800 is depicted. Voltage source 507 generates voltage 801 (VDD), voltage source 508 generates voltage 802 (VDDCORE), and voltage source 509 generates voltage 803 (VDDFLASH). The period between time TU0 and TU3 depict the power-on sequence, and the period between time TD0 and TD2 depicts the power-down sequence. Unlike in the prior art, voltage 801 (VDD) and voltage 803 (VDDFLASH) begin ramping up at the same time, time TU0, during the power-up sequence, and voltage 801 (VDD), voltage 802 (VDD-CORE), and voltage 803 (VDDFLASH) reach 0V at the same time, time TD2. During the power-up phase, while the voltage 801 and 803 (VDDFLASH) are ramping up and stabilize at a final voltage between time TU0 and TU1, the voltage 802 (VDDCORE) essentially stays at zero volts and starts to ramp up at time TU2 and stabilize at time TU3. During time TU0 and TU3 the circuits of voltage 803 (VDDFLASH) and the circuits of the voltage 802 (VDD-CORE) are enabled or disabled by a VDD control logic powered by the voltage 801 (VDD). In one embodiment, the voltage 802 (VDDCORE) is at a float level (high-Z) during the voltage 801 (VDD) ramping up period between TU0 and TU1.

Figure 9:
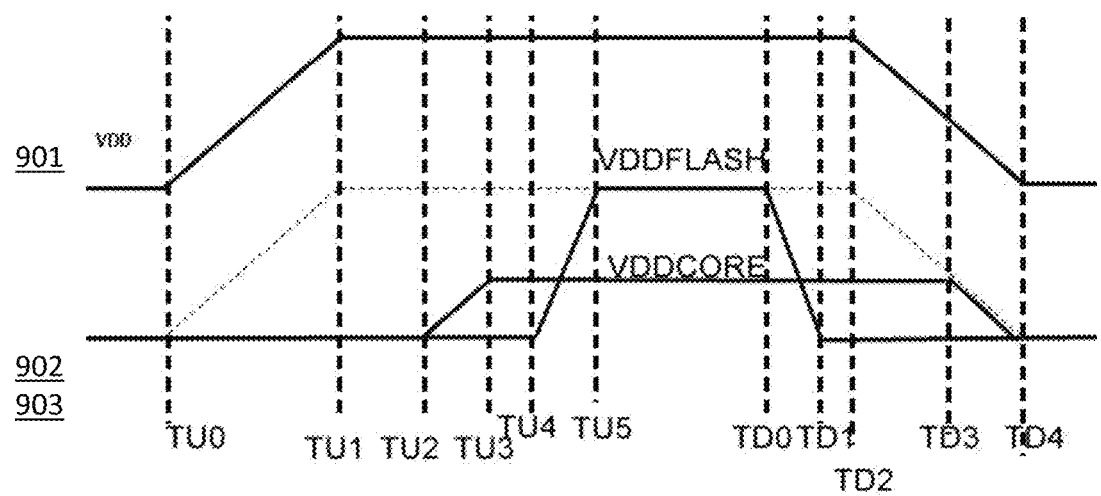
FIG. 9 depicts another power sequencing embodiment.

With reference to FIG. 9, power sequencing mode 900 is depicted. Voltage source 507 generates voltage 901 (VDD), voltage source 508 generates voltage 902 (VDDCORE), and voltage source 509 generates voltage 903 (VDDFLASH). The period between time TU0 and TU5 depict the power-on sequence, and the period between time TD0 and TD4 depicts the power-down sequence. The power-up sequence is similar to that of the power up sequence mode 700. The power-down sequence a mirrored sequence of the power up sequence.

Figure 10:
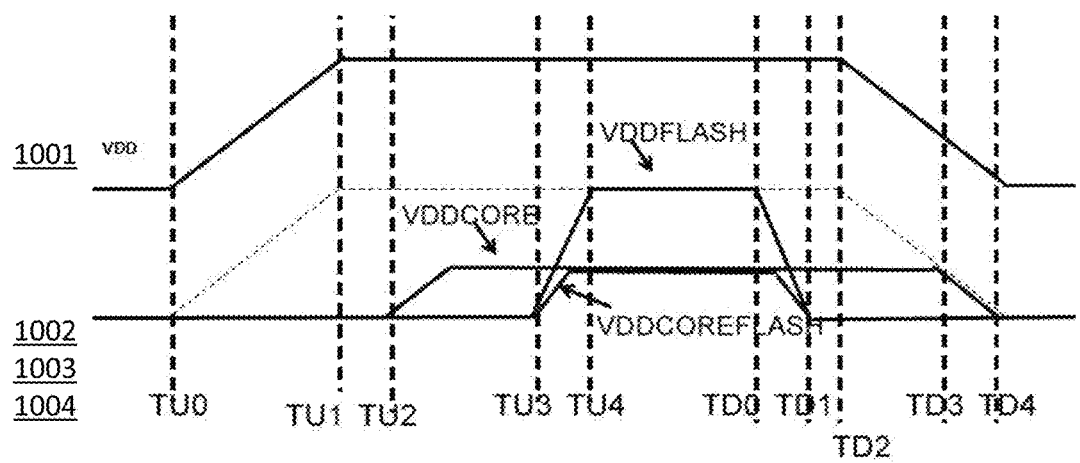
FIG. 10 depicts another power sequencing embodiment.

With reference to FIG. 10, power sequencing mode 1000 is depicted. Voltage source 507 generates voltage 1001 (VDD), voltage source 508 generates voltage 1002 (VDD-CORE), voltage source 509 generates voltage 1003 (VDD-FLASH), and voltage source 510 generates voltage 1004 (VDDCOREFLASH). The period between time TU0 and TU4 depicts the power-on sequence, and the period between time TD0 and TD4 depicts the power-down sequence. Unlike in the prior art, voltage 1001 (VDD) and voltage 1002 (VDDCORE) reach 0V at the same time, time TD4. The voltage 1003 (VDDFLASH) and the voltage 1004 (VDDCOREFLASF) and/or the voltage 1001 (VDD) and/or the voltage 1002 (VDDCORE) are supplied to the embedded flash device 505. The voltage 1003 (VDDFLASH) and the voltage 1004 (VDDCOREFLASF) both are ramping up and down at the same time (or approximately at the same time).

In the above described power sequence modes 600, 700, 800, 900, 1000, and 1100, the embedded flash device 505 receives the voltage 603/703/803/903/1003/1103 (VDD-FLASH), the voltage 1004 (VDDCOREFLASH), and/or the voltage 601/701/801/901/1001/1101 (VDD) and/or the voltage 602/702/802/902/1002/1102 (VDDCORE). In one embodiment, high voltage charge pump circuits needed for flash such as for programming and erasing is powered from the voltage 601/701/801/901/1001/1101 VDD. In another embodiment, high voltage charge pump circuits needed for flash such as for programming and erasing is powered from the voltage 603/703/803/903/1003/1103 VDDFLASH.

Figure 11:
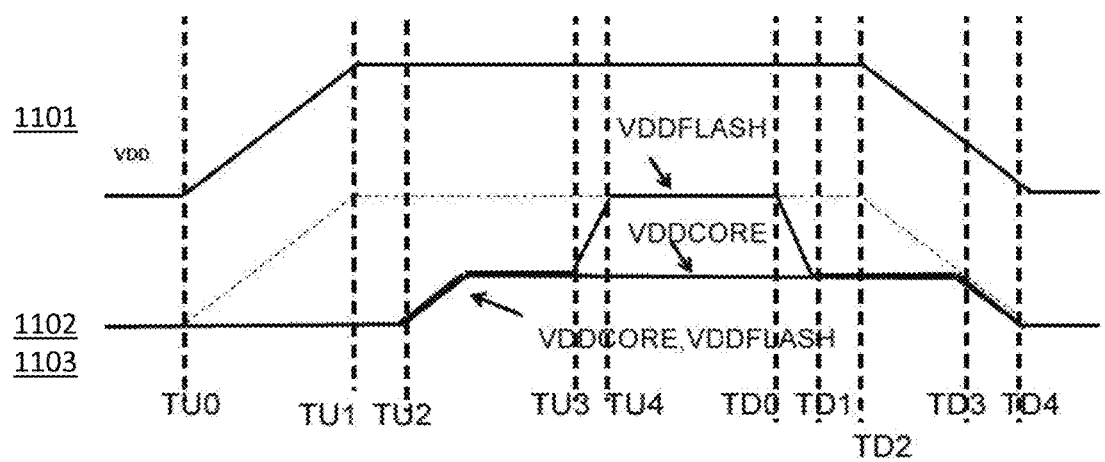
FIG. 11 depicts another power sequencing embodiment.

With reference to FIG. 11, power sequencing mode 1100 is depicted. Voltage source 507 generates voltage 1101 (VDD), voltage source 508 generates voltage 1102 (VDD-CORE), and voltage source 509 generates voltage 1103 (VDDFLASH). The period between time TU0 and TU4 depicts the power-on sequence, and the period between time TD0 and TD4 depicts the power-down sequence. Unlike in the prior art, voltage 1102 (VDDCORE) and voltage 1103 (VDDFLASH) begin ramping up at the same time, time TU2, during the power-on sequence and begin ramping down at the same time, time TD3, during the power-down sequence, and voltage 1101 (VDD), voltage 1102 (VDD-CORE), and voltage 1103 (VDDFLASH) reach 0V at the same time, time TD2. The power-down sequence is mirrored sequence of the power up sequence. The voltage 1103 (VDDFLASH) starts to ramp up after the voltage 1102 (VDDCORE) stabilizes.

Figure 12:
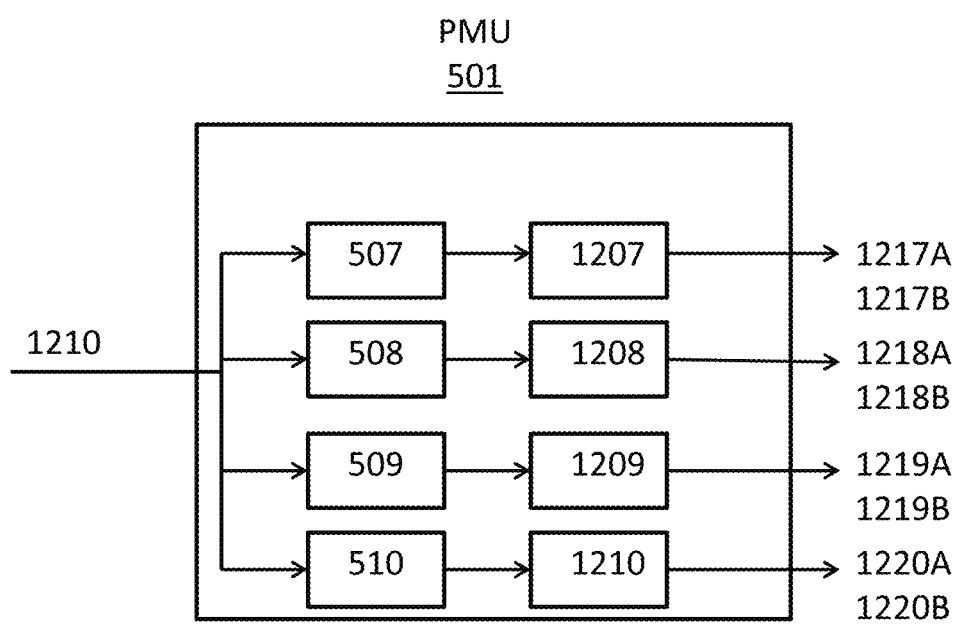
FIG. 12 depicts a power-ready circuit.

With reference to FIG. 12, control system 1200 for power management unit 501 is depicted. Reset signal 1210 is coupled to voltage source 507, voltage source 508, voltage source 509, and voltage source 510. When reset signal 1210 is active, voltage source 507, voltage source 508, voltage source 509, and voltage source 510 are reset, which can comprise entering power-down mode. Detector circuit 1207 receives a voltage (VDD) from voltage source 507, detector circuit 1208 receives a voltage (VDDCORE) from voltage source 508, detector circuit 1209 receives a voltage (VDD-FLASH) from voltage source 509, and detector circuit 1210 receives a voltage (VDDCOREFLASH) from voltage source 510.

Detector circuit 1207 determines if the voltage from voltage source 507 is above thresholds V1A and V1B (V1B>V1A), and outputs detection ready signals 1217A and 1217B respectively. If signal 1217A/1217B is high, then the voltage from voltage source 507 (VDD) is above the threshold V1A/V1B.

Detector circuit 1208 determines if the voltage from voltage source 508 is above thresholds V2 A and V2B (V2B>V2A), and outputs detection ready signals 1218 A and 1218B respectively. If signal 1218A/1218B is high, then the voltage from voltage source 508 (VDDCORE) is above the threshold V2A/V2B.

Detector circuit 1209 determines if the voltage from voltage source 509 is above thresholds V3 A and V3B (V3B>V3A), and outputs detection ready signal 1219 A and 1219B respectively. If signal 1219A/1219B is high, then the voltage from voltage source 509 (VDDFLASH) is above the threshold V3A/V3B.

Detector circuit 1210 determines if the voltage from voltage source 510 is above thresholds V4 A and V4B (V4B>V4A), and outputs detection ready signal 1220 A and 1220B respectively. If signal 1220A/1220B is high, then the voltage from voltage source 510 (VDDCOREFLASH) is above the threshold V4A/V4B.

The signals 1217A/1217B, 1218A/1218B, 1219A/1219B, 1220A/1220B are used to control circuits and chip functionality during ramping up of the power up sequence and during ramping down of the power down sequence such as to avoid circuit contention and undesirable power consumption.

Figure 13:
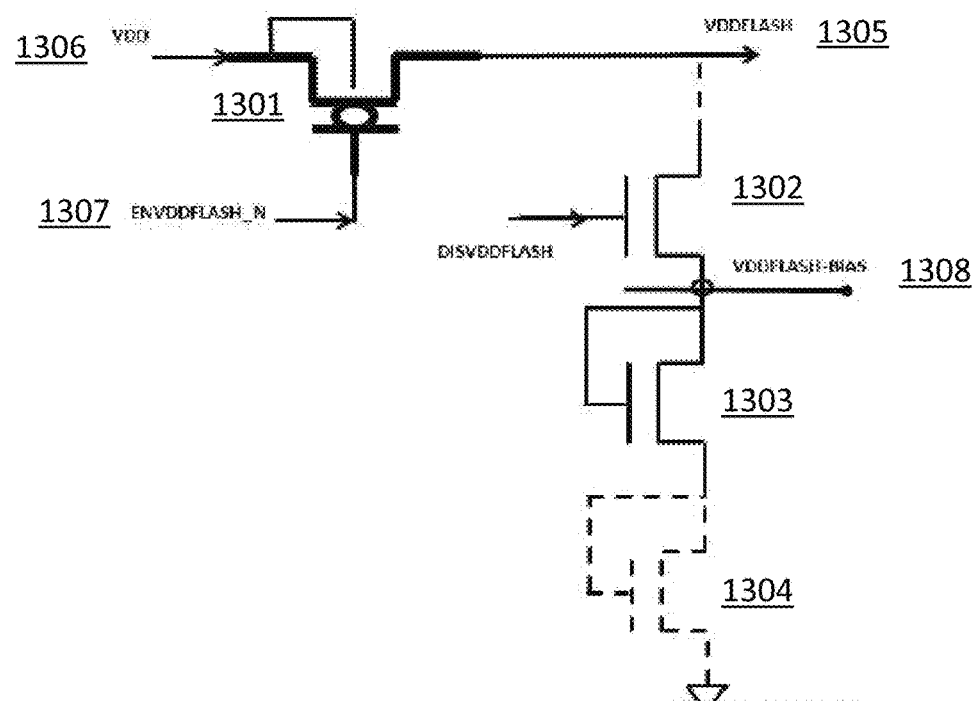
FIG. 13 depicts a power sequence enabling circuit.

With reference to FIG. 13, power sequence enabling circuitry 1300 is depicted. Power sequence enabling circuitry 1300 comprises PMOS transistor 1301, NMOS transistor 1302, NMOS transistor 1303, and optional NMOS transistor 1304, coupled as shown in FIG. 13. VDDFLASH 1305 is generated when VDD 1306 is present and ENVDD-FLASH_N 1307 is active. VDDFLASH 1305 will be less than VDD 1306 based on the voltage drop across PMOS transistor 1301. When ENVDDFLASH_N 1307 is not active, VDDFLASH 1305 will drop to a lesser voltage determined by VDDFLASH-BIAS 1308 and the voltage drop across NMOS transistor 1302. Thus, VDDFLASH 1305 will drop to a voltage around VDDFLASH-BIAS 1308 instead of to 0 V. In another embodiment the VDDFLASH-BIAS 1308 is equal to core logic power supply VDD such as the voltage 702 (VDDCORE) of the power sequencing mode 700. In another embodiment the VDDFLASH-BIAS 1308 is floating (high-Z). In another embodiment the transistors 1302, 1303, and 1304 are not connected, meaning the VDDFLASH 1305 is floating (high-Z) when the PMOS transistor 1301 is not enabled.

Figure 14:
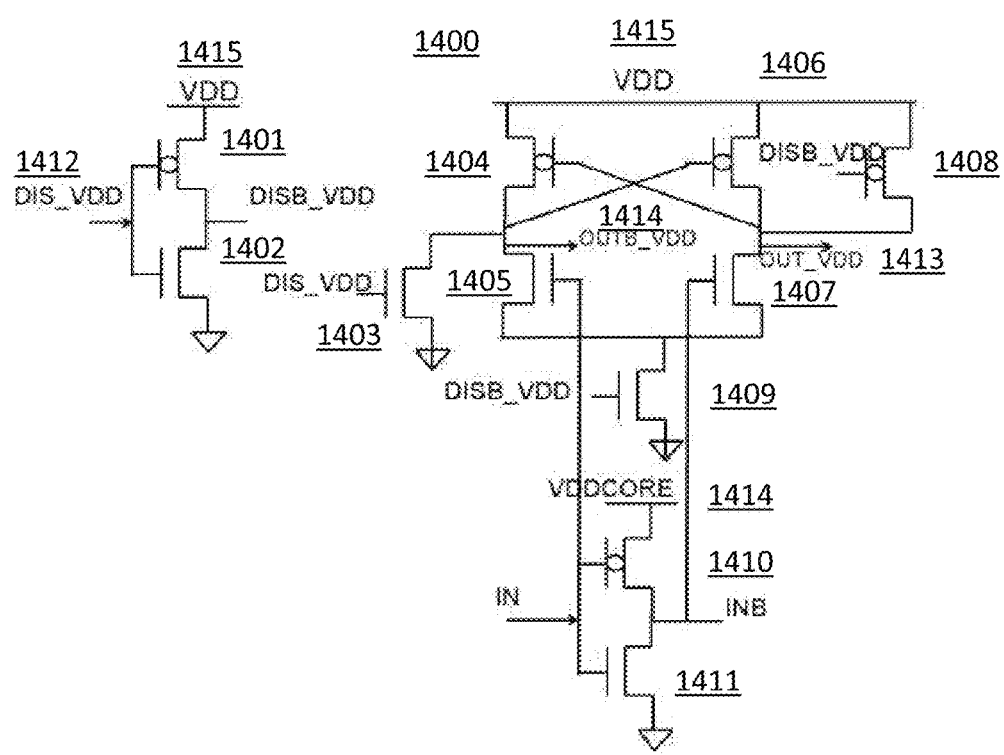
FIG. 14 depicts a voltage level shifter system.

With reference to FIG. 14, VDD level shifter system 1400 is depicted. VDD level shifter system 1400 comprises PMOS transistor 1401 coupled to NMOS transistor 1402 as shown. VDD level shifter system 1400 further comprises NMOS transistor 1403, PMOS transistor 1404, NMOS transistor 1405, PMOS transistor 1406, NMOS transistor 1407, PMOS transistor 1408, NMOS transistor 1409, PMOS transistor 1410, and NMOS transistor 1411, coupled as shown. The PMOS transistor 1410 and NMOS transistor 1411 are powered by a core logic power supply 1414 (VDDCORE). The PMOS transistor 1401 and NMOS transistor 1402 are powered by an IO power supply 1415 (VDD). The PMOS transistors 1404/1406 and NMOS transistors 1405/1407 are powered by the IO power supply 1415 (VDD). The transistors 1401,1402,1403,1409 and 1408 constitutes power controlling element for the VDD level shifter 1400. The transistors 1404, 1406, 1405, 1407, 1410, and 1411 constitutes a normal level shifter. When DIS_VDD 1412 is set to "1," OUT_VDD 1413 will be VDD, and OUTB_VDD 1414 will be 0. In one embodiment, power supply level for transistor 1401 and the signal DIS_VDD 1412 is greater or equal to power supply level for the transistors 1404, 1406, and 1408. With this circuit configuration the outputs 1414 and 1413 are at known state with control signal DIS_VDD 1412 being active.

Figure 15:
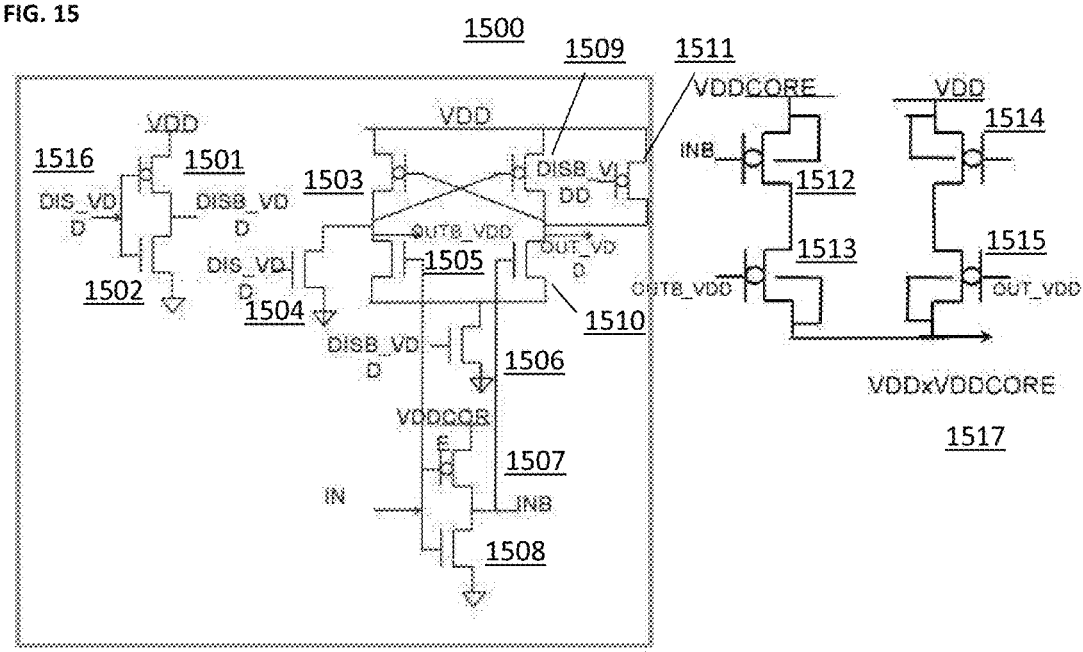
FIG. 15 depicts a power disabling system.

With reference to FIG. 15, power disabling system 1500 is depicted. Power disabling system 1500 comprises PMOS transistor 1501 and NMOS transistor 1502, coupled as shown. Power disabling system 1500 further comprises PMOS transistor 1503, NMOS transistor 1504, NMOS transistor 1505, NMOS transistor 1506, PMOS transistor 1507, NMOS transistor 1508, PMOS transistor 1509, NMOS transistor 1510, and PMOS transistor 1511, coupled as shown as a power supply level shifter. The transistor 1501, 1502, 1504, 1506, and 1511 will cause the outputs of this level shifter to be at a known state similar to that of the circuit 1400 due to similar power controlling elements. Power disabling system 1500 further comprises PMOS transistor 1512 (its bulk connected to its source), PMOS transistor 1513 (its bulk connected to its drain), PMOS transistor 1514 (its bulk connected to its source), and PMOS transistor 1515 (its bulk connected to its drain), coupled as shown. When DIS_VDD 1516 is "1," VDDxVDDCORE 1517 is equal to VDDCORE.

References to the present invention herein are not intended to limit the scope of any claim or claim term, but instead merely make reference to one or more features that may be covered by one or more of the claims. Materials, processes and numerical examples described above are exemplary only, and should not be deemed to limit the claims. It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between). For example, forming an element "over a substrate" can include forming the element directly on the substrate with no intermediate materials/elements there between, as well as forming the element indirectly on the substrate with one or more intermediate materials/elements there between.

What is claimed is:

1. A power management unit comprising a first voltage source and a second voltage source configured to perform a power-on sequence, wherein:
    during a first time period, the voltage output from the first voltage source ramps upward and the voltage output from the second voltage sour ramps upward;
    during a second time period immediately following the first time period, the voltage output from the first voltage source ramps upward and the voltage output from the second voltage remains at a constant level;
    during a third time period immediately following the second time period, the voltage output from the first voltage source ramps upward and the voltage output from the second voltage sour ramps upward; and
    during a fourth time period immediately following the third time period, the voltage output from the first voltage source ramps upward and the voltage output from the second voltage source remains at a constant level.

2. The power management unit of claim 1, wherein the first voltage source and the second voltage source are configured to perform a power-down sequence, wherein:
    during a fifth time period, the voltage output from the first voltage source ramps downward and the voltage output from the second voltage remains at a constant level;
    during a sixth time period immediately following the fifth time period, the voltage output from the first voltage source ramps downward and the voltage output from the second voltage ramps downward and then remains at a constant level; and
    during a seventh time period immediately following the sixth time period, the voltage output from the first voltage source ramps downward and the voltage output from the second voltage source ramps downward.

3. The power management unit of claim 2, wherein the first voltage source, the second voltage source, and the second voltage source are configured to perform a power-down sequence, wherein:
during a sixth time period, the voltage output from the first voltage source ramps downward, the voltage output from the second voltage remains at a constant level, and the voltage output from the third voltage source ramps downward;
during a seventh time period immediately following the sixth time period, the voltage output from the first voltage source ramps downward, the voltage output from the second voltage source ramps downward, and the voltage output from the third voltage ramps downward.

4. A power management unit comprising a first voltage source, a second voltage source, and a third voltage source configured to perform a power-on sequence, wherein:
during a first time period, the voltage output from the first voltage source ramps upward, the voltage output from the second voltage sour remains at a constant level, and the voltage output from the third voltage ramps upward;
during a second time period immediately following the first time period, the voltage output from the first voltage source remains at a constant level, the voltage output from the second voltage remains at a constant level, and the third voltage source remains at a constant level;
during a third time period immediately following the second time period, the voltage output from the first voltage source remains at a constant level, the voltage output from the second voltage source ramps upward, and the voltage output from the third voltage sour remains at a constant level.

5. The power management unit of claim 4, wherein the first voltage source, the second voltage source, and the second voltage source are configured to perform a power-down sequence, wherein:
during a fourth time period, the voltage output from the first voltage source ramps downward, the voltage output from the second voltage remains at a constant level, and the voltage output from the third voltage source ramps downward;
during a fifth time period immediately following the fourth time period, the voltage output from the first voltage source ramps downward, the voltage output from the second voltage source ramps downward, and the voltage output from the third voltage ramps downward.

6. A power management unit comprising a first voltage source, a second voltage source, a third voltage source, and a fourth voltage source configured to perform a power-on sequence, wherein:
during a first time period, the voltage output from the first voltage source ramps upward, the voltage output from the second voltage sour remains at a constant level, the voltage output from the third voltage remains at a constant level, and the voltage output from a fourth voltage remains at a constant level;
during a second time period immediately following the first time period, the voltage output from the first voltage source remains at a constant level, the voltage output from the second voltage remains at a constant level, the voltage output from the third voltage source remains at a constant level, and the voltage output from the fourth voltage source remains at a constant level;
during a third time period immediately following the second time period, the voltage output from the first voltage source remains at a constant level, the voltage output from the second voltage ramps upward and then remains at a constant level, the voltage output from the third voltage source remains at a constant level, and the voltage output from the fourth voltage source remains at a constant level; and
during a fourth time period immediately following the third time period, the voltage output from the first voltage source remains at a constant level, the voltage output from the second voltage remains at a constant level, the voltage output from the third voltage source ramps upward, and the voltage output from the fourth voltage source ramps upward.

7. The power management unit of claim 6, wherein the first voltage source, the second voltage source, the third voltage source, and the fourth voltage source are configured to perform a power-down sequence, wherein:
during a fifth time period, the voltage output from the first voltage source remains at a constant level, the voltage output from the second voltage remains at a constant level, the voltage output from the third voltage source ramps downward, and the voltage output from the fourth voltage source remains constant and then ramps downward;
during a sixth time period immediately following the fifth time period, the voltage output from the first voltage source remains at a constant level, the voltage output from the second voltage remains at a constant level, the voltage output from the third voltage source remains at a constant level, and the voltage output from the fourth voltage source remains at a constant level;
during a seventh time period immediately following the sixth time period, the voltage output from the first voltage source ramps downward, the voltage output from the second voltage remains at a constant level, the voltage output from the third voltage source remains at a constant level, and the voltage output from the fourth voltage source remains at a constant level; and
during an eighth time period immediately following the seventh time period, the voltage output from the first voltage source ramps downward, the voltage output from the second voltage ramps downward, the voltage output from the third voltage source remains at a constant level, and the voltage output from the fourth voltage source remains at a constant level.

8. A power management unit comprising a first voltage source, a second voltage source, and a third voltage source configured to perform a power-on sequence, wherein:
during a first time period, the voltage output from the first voltage source ramps upward, the voltage output from the second voltage source remains at a constant level, and the voltage output from the third voltage ramps remains at a constant level;
during a second time period immediately following the first time period, the voltage output from the first voltage source remains at a constant level, the voltage output from the second voltage remains at a constant level, and the third voltage source remains at a constant level;
during a third time period immediately following the second time period, the voltage output from the first voltage source remains at a constant level, the voltage output from the second voltage source ramps upward and then remains at a constant level, and the voltage output from the third voltage source ramps upward and then remains at a constant level; and during a fourth time period immediately following the fifth time period, the voltage output from the first voltage source remains at a constant level, the voltage output from the second voltage source ramps upward and then remains at a constant level, and the voltage output from the third voltage source ramps upward.

9. The power management unit of claim 8, wherein the first voltage source, the second voltage source, and the second voltage source are configured to perform a power-down sequence, wherein:

during a fifth time period, the voltage output from the first voltage source remains at a constant level, the voltage output from the second voltage remains at a constant level, and the voltage output from the third voltage source ramps downward;

during a sixth time period immediately following the fifth time period, the voltage output from the first voltage source remains at a constant level, the voltage output from the second voltage source remains at a constant level, and the voltage output from the third voltage remains at a constant level;

during a seventh time period immediately following the sixth time period, the voltage output from the first voltage source ramps downward, the voltage output from the second voltage source remains at a constant level, and the voltage output from the third voltage remains at a constant level; and during a eighth time period immediately following the seventh time period, the voltage output from the first voltage source remains ramps downward, the voltage output from the second voltage source ramps downward, and the voltage output from the third voltage ramps downward.

10. A method of operating a power management control system comprising a main power source, a core logic power source, and a power control unit, comprising:

providing a first detection ready output signal when an output voltage from the main power source passes a first predetermined level;

providing a second detection ready output signal when an output voltage from the core logic power source passes a second predetermined level;

enabling, by the power control unit in response to the first detection ready output signal, the supply of power from the main power source to an embedded flash memory device; and enabling, by the power control unit in response to the second detection ready output signal, the supply of power from the core logic power source to the embedded flash memory device.

11. The method of claim 10, further comprising:

enabling, by the power control unit, the supply of power from the main power source to a charge pump circuit.

* * * * *